US006803787B1

(12) United States Patent
Wicker, Jr.

(10) Patent No.: US 6,803,787 B1
(45) Date of Patent: Oct. 12, 2004

(54) STATE MACHINE IN A PROGRAMMABLE LOGIC DEVICE

(75) Inventor: David J. Wicker, Jr., Hillsboro, OR (US)

(73) Assignee: Lattice Semiconductor Corp., Hillsboro, OR (US)

( * ) Notice: Subject to any disclaimer, the term of this patent is extended or adjusted under 35 U.S.C. 154(b) by 128 days.

(21) Appl. No.: 10/255,499

(22) Filed: Sep. 25, 2002

(51) Int. Cl.[7] .......................................... H03K 19/173
(52) U.S. Cl. ...................................... 326/46; 326/38
(58) Field of Search .............................. 326/38–41, 46

(56) References Cited

U.S. PATENT DOCUMENTS

| | | | |
|---|---|---|---|
| 4,642,487 A | | 2/1987 | Carter |
| 4,663,545 A | * | 5/1987 | Pumo et al. ................ 326/105 |
| 4,706,216 A | | 11/1987 | Carter |
| 4,758,985 A | | 7/1988 | Carter |
| 5,646,544 A | * | 7/1997 | Iadanza ....................... 326/38 |
| 5,650,734 A | * | 7/1997 | Chu et al. .................... 326/38 |
| 5,705,938 A | * | 1/1998 | Kean .......................... 326/39 |
| 5,754,459 A | | 5/1998 | Telikepalli |
| 5,825,199 A | * | 10/1998 | Shelton et al. ............... 326/38 |
| 5,869,980 A | * | 2/1999 | Chu et al. .................... 326/38 |
| 6,011,407 A | * | 1/2000 | New .......................... 326/39 |
| 6,259,271 B1 | * | 7/2001 | Couts-Martin et al. ....... 326/40 |
| 6,362,650 B1 | | 3/2002 | New et al. |

OTHER PUBLICATIONS

"Stratix: Programmable Logic Device Family," Altera Corporation, Aug. 2002, Ver. 2.1 Data Sheet.
"Silicon," Xilinx Products website, http://www.xilinx.c m/xlnx/xil_pr dc t_pr duct.jsp?title+silic n, printed Sep. 16, 2002, 3 pages.
Chameleon Systems — Your Communication Platform; from website www.chameleonsystems.com, 5 pages, Mar. 4, 2002.
"Tool suite supports reconfigurable processor" article by Richard Goering; published in *EE Times* on Aug. 14, 2001, 6 pages.
Xilinx Home; Virtex–II Pro Platform FPGAs; The Platform for Programmable Systems; from website www.xilinx.com, 3 pages, Sep. 16, 2002.
Xilinx Home; PowerPC Embedded Processor Solution; from website www.xilinx.com, 2 pages, Mar. 4, 2002.
Xilinx Home; The First Platform FPGA Solution; from website www.xilinx.com, 2 pages, Mar. 4, 2002.
Xilinx Home; Virtex–II Platform FPGA Features; from website www.xilinx.com, 3 pages, Mar. 4, 2002.
QuickLogic Home; QuickRAM, Dual–Port Embedded RAM for Extremely High Performance Functions; from website www.quicklogic.com, 3 pages, Mar. 4, 2002.
QuickLogic Home; QuickDSP, Embedded DSP Building Blocks for High–Performance, Complex DSP Designs; from website www.quicklogic.com, 2 pages, Mar. 4, 2002.
QuickLogic Home; Eclipse, High Performance FPGAs with Enhanced Logic Supercell; from website www.quicklogic.com, 3 pages, Mar. 4, 2002.
"Re–configurable High Speed Arithmetic Functions in a Non–Volatile FPGA", written by Rufino T. Olay III, Customer Engineer at QuickLogic, 6 pages, Mar. 4, 2002.
High Performance Multipliers in QuickLogic FPGAs, written by John Birkner, Jim Jian and Kevin Smith of QuickLogic, 9 pages, Mar. 4, 2002.

* cited by examiner

Primary Examiner—Don Le (57) ABSTRACT

A programmable logic device (PLD) is disclosed that includes a state machine integrated into a block memory. The state machine includes state machine logic and memory elements from the block memory. The state machine logic and memory elements together may be used as an instruction unit of a processor. In such a case, the instruction unit is coupled to a processor execution unit to form a high-performance, embedded processor within a PLD.

22 Claims, 7 Drawing Sheets

COMBINED MEMORY BLOCK
AND STATE MACHINE

STATE MACHINE IN A PROGRAMMABLE LOGIC DEVICE

TECHNICAL FIELD

The present invention relates to programmable circuits. More particularly, the present invention relates to state machines in programmable logic devices.

BACKGROUND

Non-volatile memory devices, such as EPROM, EEPROM, and Flash EEPROM, store data even after power is turned off. One common application of EEPROMs is in programmable logic devices (PLDs). PLDs are standard semiconductor components purchased by systems manufacturers in a "blank" state that can be custom configured into a virtually unlimited number of specific logic functions. PLDs provide system designers with the ability to quickly create custom logic functions to provide product differentiation without sacrificing rapid time to market. PLDs may be reprogrammable, meaning that the logic configuration can be modified after the initial programming.

One type of PLD is known as a Field-Programmable Gate Array (FPGA). An FPGA is a general purpose device that can be programmed by an end user to perform one or more selected functions. An FPGA typically includes an array of individually programmable logic cells (PLCs), each of which is programmably interconnected to other PLCs and to input/output (I/O) pins via a programmable routing structure to provide the selected function. Examples of such devices are exemplified in U.S. Pat. Nos. 4,642,487; 4,706,216; and 4,758,985.

An FPGA device can be characterized as an integrated circuit that may include four major features:

(1) A user-accessible, configurable memory device, such as SRAM, EPROM, EEPROM, anti-fused, fused, or other, is provided in the FPGA device so as to be at least once-programmable by device users for defining user-provided configuration information. Static Random Access Memory or SRAM is a form of reprogrammable memory that may be differently programmed many times. Electrically Erasable programmable ROM or EEPROM is another example of nonvolatile reprogrammable memory. The configurable memory of an FPGA device may be formed of a mixture of different kinds of memory elements if desired (e.g., SRAM and EEPROM).

(2) Input/Output Blocks (IOBs) are provided for interconnecting other internal circuit components of the FPGA device with external circuitry. The IOBs may have fixed configurations or they may be configurable in accordance with user-provided configuration information.

(3) PLCs are provided for carrying out user-programmed logic functions (e.g., logic gates) as defined by user-provided configuration information. Typically, each of the many PLCs of an FPGA has at least one lookup table (LUT) that is user-configurable to define any desired truth table. A PLC may have other resources such as LUT input signal pre-processing resources and LUT output signal post-processing resources.

(4) An interconnect network is provided for carrying signal traffic within the FPGA device between various PLCs and/or between various IOBs and/or between various IOBs and PLCs. At least part of the interconnect network is typically configurable so as to allow for programmably-defined routing of signals between various PLCs and/or IOBs in accordance with user-defined routing information.

Using these features, traditional FPGA architectures implement state machines by using the LUT-based logic elements in a decoding structure and as register storage elements. The state machine typically includes multiple states that are cycled through based on input signals. Typically, every clock cycle, the state of the input signals dictates whether the state machine maintains its current state or changes to a new state. Although state machines may be easily constructed in an FPGA, as the state machine grows large, performance begins to suffer as logic elements invariably get located at greater distances apart, thereby slowing propagation times. Additionally, such state machines consume a lot of area.

Thus, it is desirable to provide a PLD that can free PLC resources while increasing overall functionality. It is also desirable to implement an efficient state machine within a PLD.

SUMMARY

A PLD is disclosed that includes a state machine integrated into a block memory. The state machine includes state machine logic and memory elements from the block memory. The state machine logic and memory elements together may be used as an instruction unit of a processor. In such a case, the instruction unit functions as a counter, instruction store, and possibly a decode that is coupled to a processor execution unit to form a high-performance, embedded processor.

In one aspect, the state machine logic includes a program counter and an adder coupled to memory elements within the block memory.

In another aspect, control logic may be added to the state machine to receive state machine inputs and to determine the next state of the state machine.

In another aspect, the state machine may further include a stack pointer that is used to implement a stack within the block memory.

In yet another aspect, the state machine allows for implementing certain classes of instructions, such as jumps, branches and calls. Additionally, processor interrupts can be handled within the memory block.

These and other aspects will become apparent from the following detailed description, which makes reference to the accompanying drawings.

DETAILED DESCRIPTION

Figure 1:
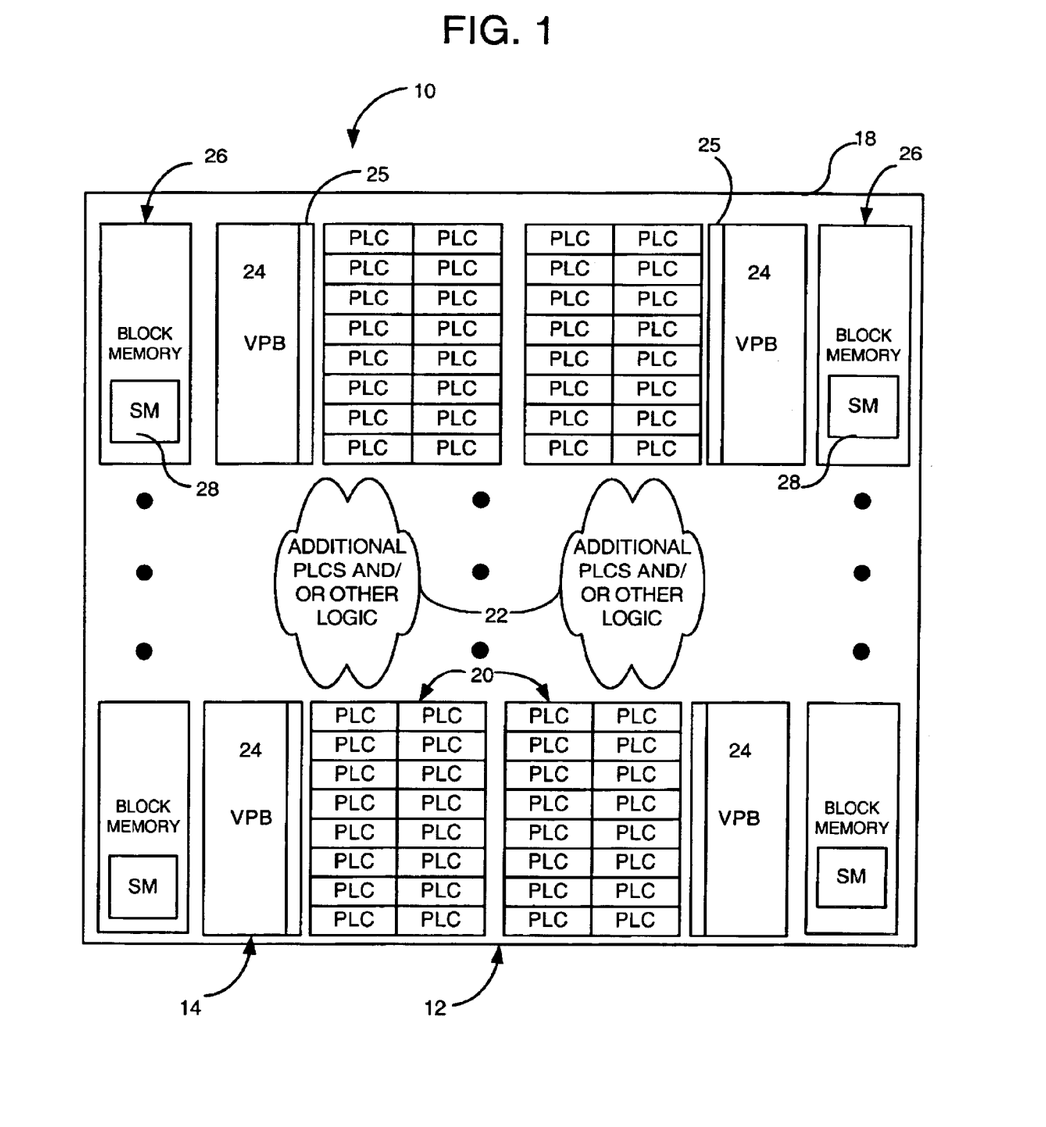
FIG. 1 shows a high-level diagram of a programmable logic device having a state machine integrated into a block memory, wherein the state machine may be used to control various vector processing blocks.

FIG. 1 shows a high-level diagram of a PLD 10 in accordance with the invention. The PLD may be one of many types of programmable devices, such as a field-programmable gata ray (FPGA). The PLD may contain several domains, such as a PLD domain (shown generally at 12) and a vector domain (shown generally at 14). The PLD domain 12 may include conventional fine grain logic, memory and routing resources where signals are switched and routed on a bit-by-bit basis. Such bit-by-bit manipulation is termed unordered because the bits are not arranged in a predetermined order throughout the domain. The vector domain may include coarse grain logic blocks (also referred to herein as vector processing blocks or VPBs) that perform functions on digital words (integer operands) that include multiple bits grouped together (e.g., 16, 32, 64 bits, etc.) in a predetermined order throughout the domain. These words of ordered bits are referred to as vectors. Vectors are groups of wires that are routed together as a vector signal path so that all of the bits in the digital word are manipulated as a vector. That is, the bits in a vector are controlled and switched at once as a group.

The PLD is housed in an outer package 18, which includes input/output pins (not shown). The PLD has multiple columns of programmable logic cells (PLC) as shown generally at 20. The number of columns of PLCs varies based on the design. As shown at 22, additional PLCs and/or other logic may also exist within the PLD. For example, other devices (e.g., stand-alone memories, multipliers, etc.) may be included in logic 22. The illustrated PLD 10 includes one or more columns of VPBs, including VPBs shown at 24. Within each VPB is an interface 25 to facilitate communication with the adjacent PLCs. The interface 25 may be used to convert selected unordered bits from the PLD domain 12 to the vector domain 14.

In the illustrated design, there is one interface per VPB, although additional interfaces may be included. The PLD 10 also includes one or more columns of block memories shown generally at 26. As indicated generally at 28, a state machine is integrated into the block memories. The block memories 26 are shown placed adjacent to the VPBs and coupled thereto to form a processor. More specifically, the VPB may be a processor execution unit that, together with the block memory 26 and integrated state machine 28, forms an embedded processor. In this context, the state machine is an instruction unit of the processor. However, the state machine may be used for other purposes as well, and need not necessarily be used in conjunction with a processor.

Figure 2:
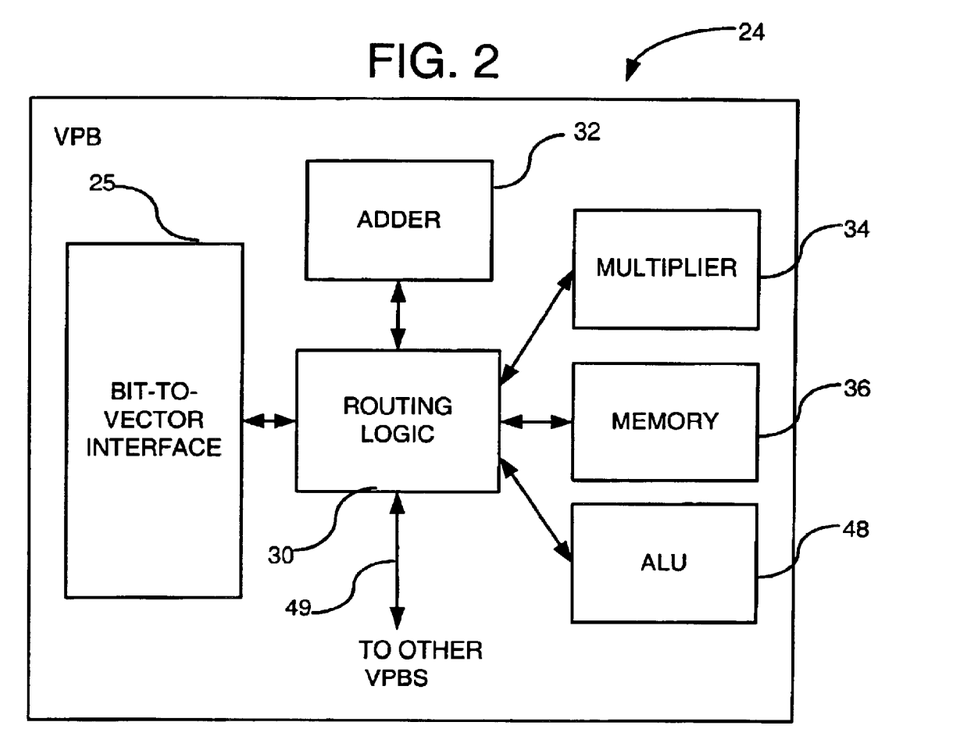
FIG. 2 is a block diagram of an exemplary vector-processing block of FIG. 1.

FIG. 2 shows a more detailed diagram of a VPB 24. Routing logic 30 is coupled to the interface 25 and facilitates routing to various components (i.e., engines) within the VPB. For example, the VPB may include one or more of the following engines: adders (e.g., adder 32), multipliers (e.g., multiplier 34), memory (e.g., memory 36) and ALUs (e.g., ALU 48). As shown at 49, the VPB 24 may be connected via the routing logic 30 to engines within other VPBs in the PLD 10. Thus, the vectors can be routed between VPBs. Other features of the VPB are not shown but may be readily included, such as VPB engines (i.e. specialized pipelined datapath units that perform functions with vector data, which would be especially expensive or difficult to accomplish with PLD cells). Preferably, the VPB is not a general-purpose processor execution unit. In the illustrated embodiment it is an application-specific embedded processor execution unit that requires a relatively small program store and only communicates with dedicated internal resources. The embedded processor execution unit is not built from combinations of programmable logic blocks. Instead, it is made from logic that is designed for a particular type of function (e.g., multiply, add, etc.). By contrast, general processors require large program stores and flexible interfaces to support a wide range of peripheral devices, such as keyboards, disk drives, printers and scanners. As further described below, the embedded processor execution unit may be combined with an instruction unit (formed from a memory block with an integrated state machine) to form an embedded processor. Additionally, the processor execution unit may be dynamically reconfigurable such that hardware in the processor is changeable during operation.

Figure 3:
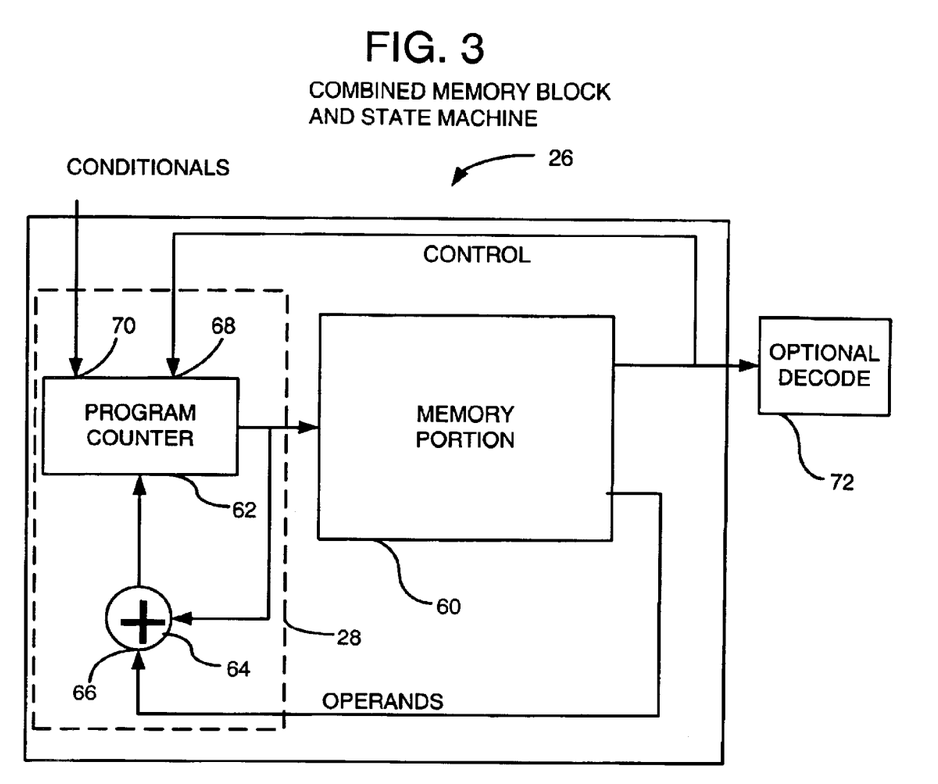
FIG. 3 is an example of a block memory with an integrated state machine.

FIG. 3 shows the block memory 26 in more detail. A memory elements portion 60 operates as an instruction store (the memory portion may also include a decode). The memory elements 60 may be a random access memory (RAM) or a read-only memory (ROM), either of which includes memory elements that are uniquely addressable. State machine logic 28 integrated into the block memory includes a program counter 62 and an adder 64. The program counter 62 is a standard program counter that points to an instruction in the memory portion 60. The program counter 62 may include a loadable counter, control logic and a decoder (not shown). The actual logic to control the program counter may vary depending on the particular implementation, but some examples include logic to add/subtract a value, increment, decrement, load a value, or do nothing. This set allows unrestricted two-way branching to most states. The adder 64 is coupled to the program counter 62 and allows for some of the program-counter functions discussed above. For example, the adder may be used to increment the program counter or to allow jump operations using an input from an operand input terminal 66 coupled to the memory portion 60. A control input terminal 68 is coupled to the program counter 62. A control signal may be provided to the control input terminal 68 from the memory portion 60 or a separate controller (not shown). Conditional inputs received on a conditional input terminal 70 may also be coupled to the program counter 62 and used in the determination of the next state of the state machine. An additional output latch (not shown) may be added to allow branching to any state, but with the outputs held at their prior state. The output latch would have an enable controlled by data bit from the memory 60. By disabling the latch, the previous outputs are held, and the memory output is then used to determine the next state. In the case where the state machine is used as an instruction unit, a decode 72 may be coupled to the block memory 26 to decode the instruction sent to the VPB 24 (FIG. 1).

Memory 26, of course, can also function simply as conventional memory. Whether it functions as part of a state machine or as conventional memory depends upon how the PLD is configured.

Figure 4:
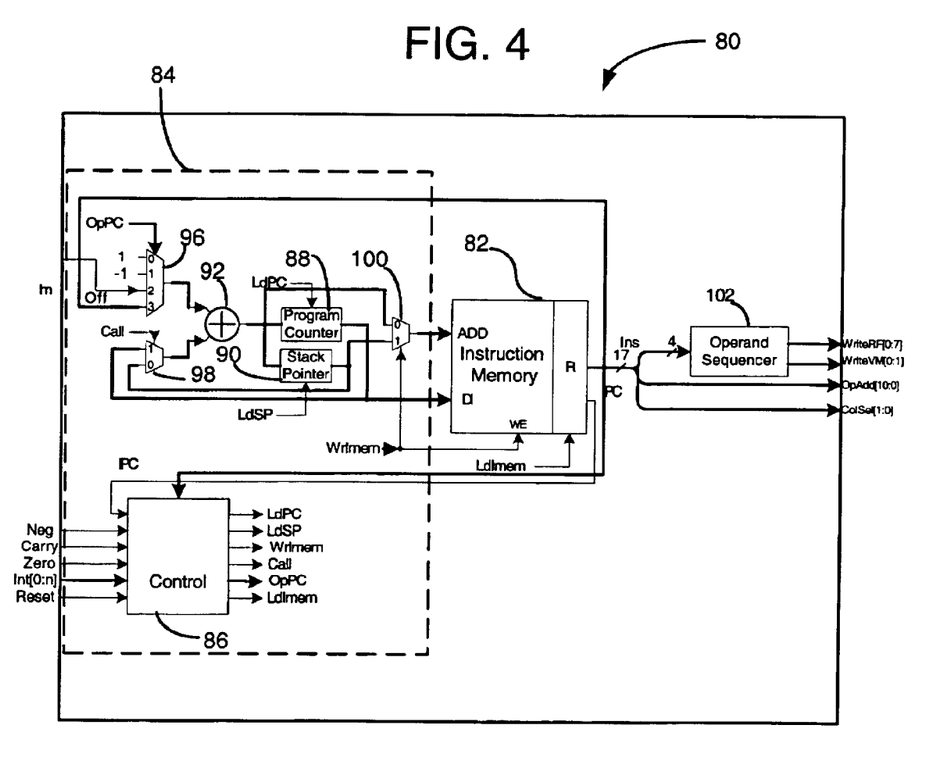
FIG. 4 is a more detailed example of a block memory with an integrated state machine.

FIG. 4 shows another example of a block memory with an integrated state machine 80. In this example, the block memory with integrated state machine is shown as an instruction unit used to control a processor execution unit. An instruction memory 82 stores the desired outputs of the block memory 80 based on a current state as identified by state machine logic 84. In this example, the state machine logic 84 includes a control unit 86, a program counter 88, a stack pointer 90 and an adder 92. The control unit 86 has multiple conditional inputs including negate (neg), carry, zero, interrupts (int [0:n]), and reset. The control unit 86 also includes simple decode logic (not shown) that is used to generate the illustrated output signals: load program counter (LdPC), load stack pointer (LdSP), write instruction memory (Wrlmem), call, operate on program counter (OpPC), and load instruction memory (Ldlmem). Multiplexer 96 is used to provide different inputs to the adder 92 so that the program counter can be incremented, decremented, an immediate value (Im) can be put into the program counter or add an offset (Off) to the program counter. Multiplexer 98 either allows the program counter to be applied to the adder 92 or the stack pointer 90 to be applied to the adder 92 based on a "call" control line provided from the control unit 86. Multiplexer 100 has a control line coupled to the write instruction memory signal (Wrlmem) and inputs coupled directly to the adder 92 and the stack pointer 90. An operand sequencer 102 is coupled to the instruction memory 82 and provides different write signals to the processor execution unit. Additionally, the instruction memory 82 provides an operand address and a column select address to the processor execution unit.

Figure 5:
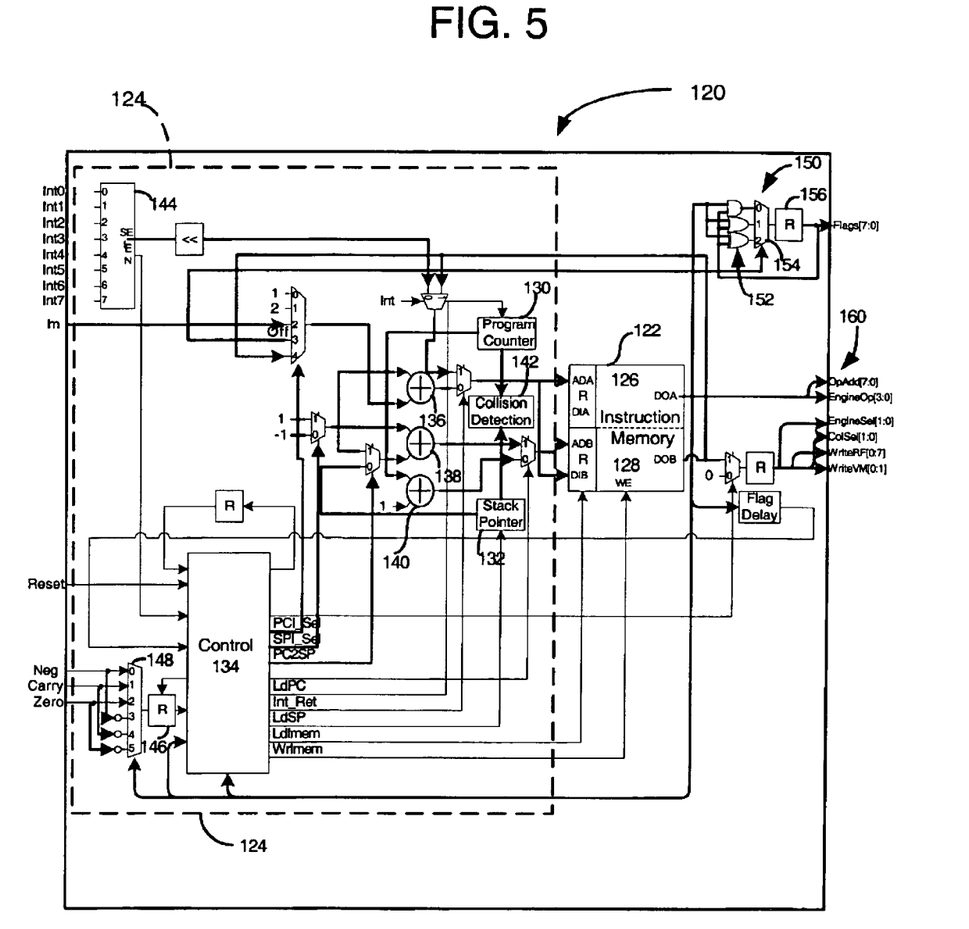
FIG. 5 is yet another example of a block memory with an integrated state machine.

FIG. 5 shows at 120 another example of a block memory with an integrated state machine. Like FIG. 4, in this example, the block memory with integrated state machine is shown as an instruction unit used to control a processor execution unit. An instruction memory is shown generally at 122, while the state machine logic is shown generally at 124. The instruction memory 122 has two portions 126 and 128, each having respective address input terminals (i.e. ADA, ADB) and data input terminals (i.e., DIA, DIB). Likewise, the instruction memory portions 126 and 128 provide separate respective data output terminals indicated at DOA and DOB. The state machine logic 124 includes a program counter 130, a stack pointer 132, a control unit 134, and multiple adders shown at 136, 138 and 140. Additionally, a collision detector 142 checks to ensure that the program counter and stack pointer do not overlap. An interrupt select register 144 has eight interrupts (int 0–int 7) input thereto. Conditional inputs are received by conditional input register 146 after passing through a multiplexer 148. The conditional input register 146 is coupled to the control unit 134, which receives the conditional inputs and uses them to determine the next state. A reset input signal is also received by the control unit 134. The instruction memory portion 126 provides a data output from terminal DOA to flag logic 150. The flag logic includes multiple logic gates 152, a multiplexer 154 and an output register 156 providing flag outputs flags [7:0]. The DOA output terminal is also coupled to an output terminal (shown generally at 160) of the block memory 120 from which the operand address (OpAdd [7:0]) and the engine operand (EngineOp [3:0]) are provided. The memory portion 128 is also coupled to the output terminal 160 of the memory block and provides the engine select output (Engine Sel [1:0]), the column select output (Col Sel [1:0]), the Write RF output (Write RF [0:7]), and the Write VM output (Write VM [0:1]).

Figure 6:
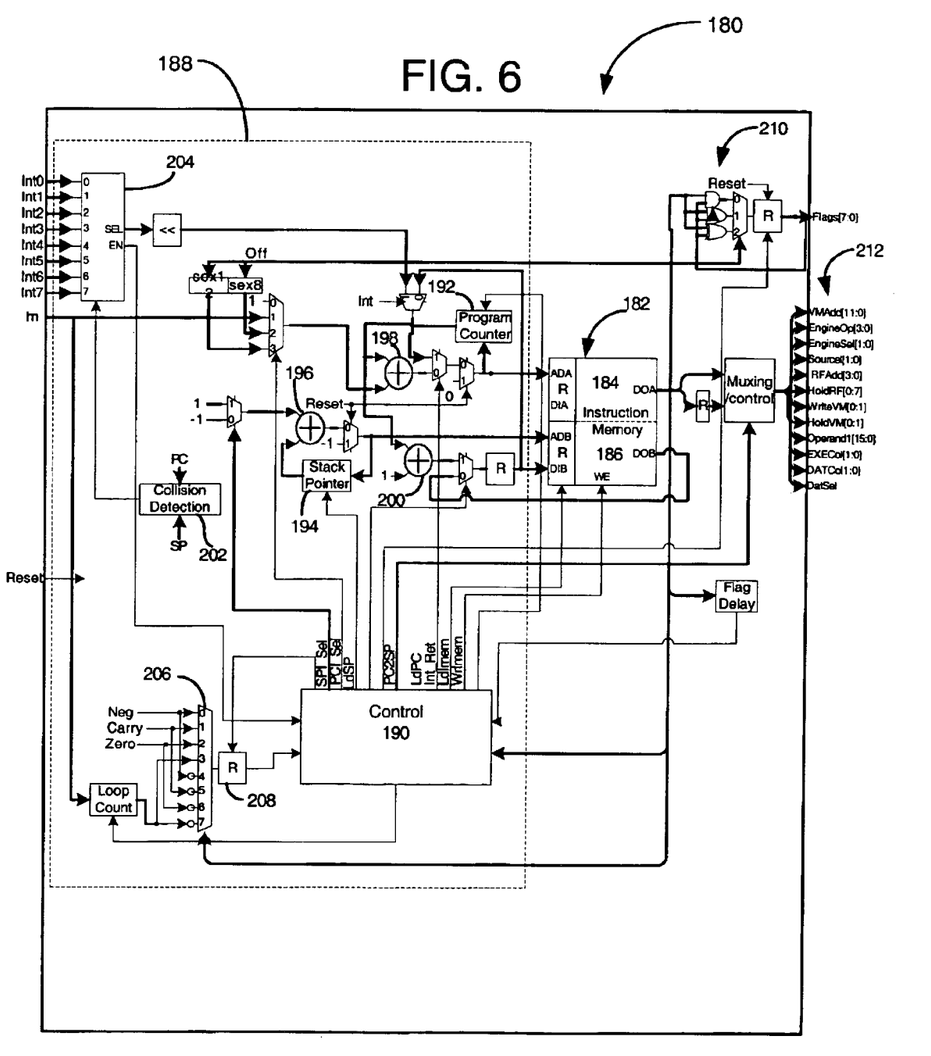
FIG. 6 is still another example of a block memory with an integrated state machine.

FIG. 6 shows another example of a block memory with an integrated state machine shown generally at 180. Like FIGS. 4 and 5, in this example, the block memory with integrated state machine is shown as an instruction unit used to control a processor execution unit. An instruction memory 182 includes portions 184 and 186 having separate address and data inputs indicated at ADA, DIA and ADB, DIB. Additionally, each portion 184, 186 has outputs as indicated at DOA and DOB. State machine logic is shown generally at 188 and includes a control unit 190, a program counter 192, a stack pointer 194, and various adders 196, 198, 200. Collision detection is shown at 202 and receives as inputs the program counter and stack pointer as previously described in relation to FIG. 5. Interrupt register 204 receives interrupts 0 through 7 similar to the interrupt register 144 of FIG. 5. Conditional inputs are received into multiplexer 206 and stored in register 208, which is coupled to the control unit 190. Portion 184 of the instruction memory 182 provides an output terminal DOA, which is fed to the flag logic shown generally at 210. The flag logic 210 provides output flags [7:0]. The DOA output also provides a variety of different output signals on an output terminal, shown generally at 212.

Figure 7:
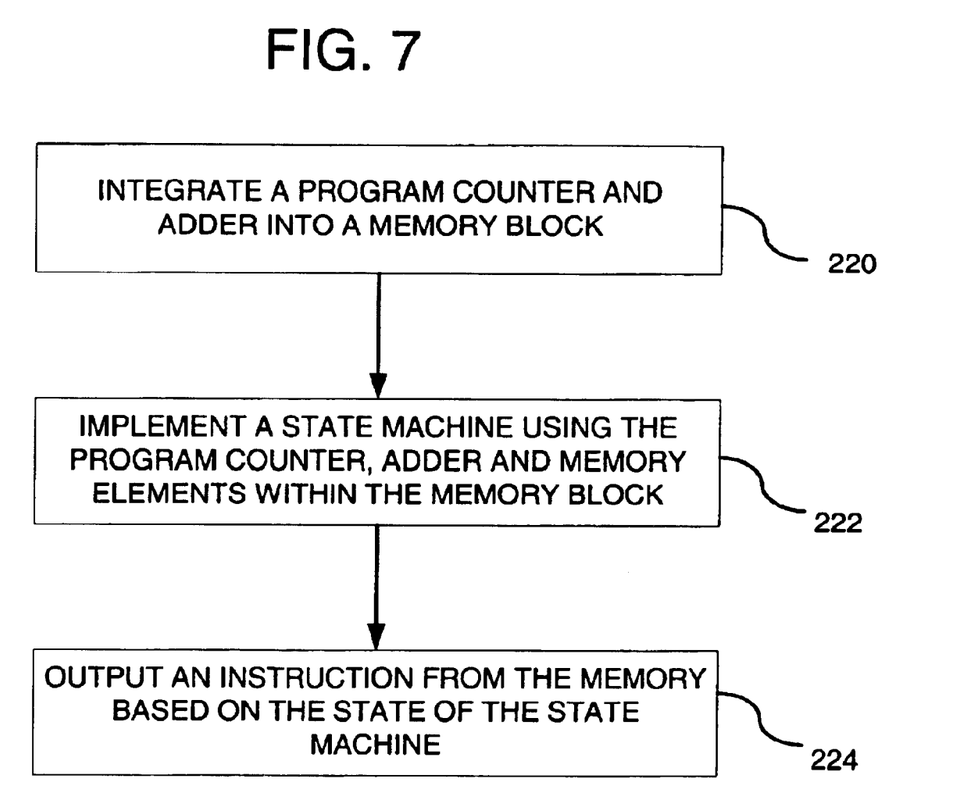
FIG. 7 is a flow chart of a method for providing an instruction to a processor using a memory block with an integrated state machine.

FIG. 7 shows a flow chart of a method for implementing and operating a state machine within a block memory. In process block 220 a program counter and adder are integrated into the memory block during fabrication of the PLD. The adder and program counter, in conjunction with memory elements, are implemented as a state machine (process block 222) during configuration of the PLD. The state machine then progresses through different states and outputs instructions from the memory block based on the current state (process block 224) during operation of the PLD.

Having illustrated and described the principles of the illustrated embodiments, it will be apparent to those skilled in the art that the embodiments can be modified in arrangement and detail without departing from such principles.

For example, although a particular structure is shown for the PLD, a wide variety of PLD layouts may be used. The principles of the invention, of course, are also applicable to other PLDs such as complex PLDs (CPLDs) and to PLDs that lack a vector domain.

Although specific embodiments are shown for the integrated state machine and block memory, a wide variety of different features may be added or subtracted, based on the specific implementation.

The invention may also apply to volatile memory devices.

In view of the many possible embodiments, it will be recognized that the illustrated embodiments include only examples and should not be taken as a limitation on the scope of the invention. Rather, the invention is defined by the following claims. I therefore claim as the invention all such embodiments that come within the scope of these claims.

I claim:

1. A programmable logic device, comprising:
    a block memory within the programmable logic device, the block memory having an array of addressable memory storage elements; and
    a state machine integrated into the block memory.

2. The programmable logic device of claim 1, wherein the array of memory storage elements is a random access memory and each memory storage element is uniquely addressable.

3. The programmable logic device of claim 1, further including an array of programmable logic blocks and a programmable switching matrix that allows the programmable logic blocks to be programmably coupled together, and wherein the block memory is coupled to the programmable switching matrix.

4. The programmable logic device of claim 1, further including a processor execution unit coupled to the state machine, wherein the state machine and the processor execution unit together form a processor.

5. The programmable logic device of claim 4, wherein the processor execution unit is dynamically reconfigurable.

6. The programmable logic device of claim 1, wherein the state machine is operable to perform one or more of the following operations: a jump, a branch, and a call.

7. The programmable logic device of claim 1, further including an instruction decoder coupled to the block memory.

8. A programmable logic device, comprising:
a block memory within the programmable logic device, the block memory having an array of addressable memory storage elements; and
a state machine integrated into the block memory, wherein the state machine includes an adder coupled to a program counter, the program counter coupled to the array of addressable memory storage elements.

9. A programmable logic device, comprising:
a block memory within the programmable logic device, the block memory having an array of addressable memory storage elements; and
a state machine integrated into the block memory, wherein the state machine includes an adder and a program counter, and further including a stack pointer integrated into the block memory.

10. A programmable logic device, comprising:
a block memory within the programmable logic device, the block memory having an array of addressable memory storage elements; and
a state machine integrated into the block memory, wherein the state machine includes an adder and a program counter, and further including control logic coupled to the adder, program counter, and memory storage elements.

11. A programmable logic device, comprising:
a block memory within the programmable logic device, the block memory having an array of addressable memory storage elements; and
a state machine integrated into the block memory; and
a vector-processing block that operates on vectors coupled to the block memory.

12. A method of fabricating a programmable logic device, comprising:
integrating a block memory into the programmable logic device, the block memory having an array of memory elements; and
integrating a state machine that includes state machine memory and state machine logic into the block memory.

13. The method of claim 12, wherein the integrated block memory and state machine are operable to perform one or more of the following operations: a jump operation, a branch operation, and a call operation.

14. The method of claim 12, further including coupling a decode to the block memory and coupling the decode to a processor execution unit.

15. The method of claim 14, wherein the processor execution unit is dynamically reconfigurable.

16. A method of fabricating a programmable logic device, comprising:
integrating a block memory into the programmable logic device, the block memory having an array of memory elements; and
integrating a state machine into the block memory, and further including integrating into the block memory a stack pointer.

17. A method of fabricating a programmable logic device, comprising:
integrating a block memory into the programmable logic device, the block memory having an array of memory elements; and
integrating a state machine into the block memory, wherein the state machine includes an adder and a program counter coupled between the adder and the memory elements.

18. A programmable logic device, comprising:
a block memory within the programmable logic device, the block memory having an array of addressable memory storage elements; and
a program counter and an adder integrating into the block memory, such that the program counter is coupled to the memory storage elements and the adder is coupled to the program counter.

19. The programmable logic device of claim 18, further including an instruction decoder coupled to the block memory.

20. A method of controlling a programmable logic device, comprising:
entering a first state in a state machine integrated into a block memory within the programmable logic device;
receiving inputs into the block memory;
using the inputs into the block memory, determining the next state of the state machine; and
outputting from the block memory an instruction to be executed by a processor execution unit.

21. The method of claim 20, further including dynamically reconfiguring the processor execution unit.

22. A programmable logic device, comprising:
state machine means for executing a state machine within a block memory in the programmable logic device; and
means for generating an instruction to a processor execution unit using the state machine means.

* * * * *